United States Patent [19]
Sooch et al.

[11] Patent Number: 5,818,370
[45] Date of Patent: *Oct. 6, 1998

[54] INTEGRATED CODEC WITH A SELF-CALIBRATING ADC AND DAC

[75] Inventors: Navdeep Singh Sooch; Michael L. Duffy, both of Austin, Tex.

[73] Assignee: Crystal Semiconductor Corporation, Austin, Tex.

[ * ] Notice: The portion of the term of this patent subsequent to Sep. 28, 2010, has been disclaimed.

The terminal 34 months of this patent has been disclaimed.

[21] Appl. No.: 128,381

[22] Filed: Sep. 28, 1993

Related U.S. Application Data

[63] Continuation of Ser. No. 790,574, Nov. 8, 1991, Pat. No. 5,248,970.

[51] Int. Cl.$^6$ ............................................. H03M 1/10
[52] U.S. Cl. .......................... 341/120; 341/110; 341/143
[58] Field of Search .................................. 341/108, 110, 341/118, 120, 143, 144, 155

[56] References Cited

U.S. PATENT DOCUMENTS

| | | | |
|---|---|---|---|
| 3,725,903 | 4/1973 | Kosakowski | 341/120 |
| 4,186,384 | 1/1980 | Acker | 341/143 |
| 4,222,107 | 9/1980 | Mrozowski et al. | 341/120 |
| 4,272,760 | 6/1981 | Prazak et al. | 341/120 |
| 4,338,589 | 7/1982 | Engel et al. | 341/120 |
| 4,340,882 | 7/1982 | Maio et al. | 341/120 |
| 4,350,975 | 9/1982 | Haque et al. | 341/120 |
| 4,364,027 | 12/1982 | Murooka | 341/120 |
| 4,381,495 | 4/1983 | Hotta et al. | 341/120 |
| 4,509,037 | 4/1985 | Harris | 341/143 |
| 4,588,979 | 5/1986 | Adams | 341/131 |
| 4,633,425 | 12/1986 | Senderowicz | 341/143 |
| 4,674,062 | 6/1987 | Premerlani | 341/118 |
| 4,796,004 | 1/1989 | Rich et al. | 341/143 |
| 4,829,236 | 5/1989 | Brenardi et al. | 341/118 |
| 4,835,535 | 5/1989 | Shibayama et al. | 341/120 |
| 4,943,807 | 7/1990 | Early et al. | 341/120 |
| 5,087,914 | 2/1992 | Sooch et al. | 341/120 |

OTHER PUBLICATIONS

Matsuya, Yasuyuki, Kuniharu Uchimura, Atushi Iwata and Takao Kaneko, "A 17–bit Oversampling D–to–A Conversion Technology Using Multistage Noise Shaping", IEEE, 1989.

"Self–Calibrating High Resolution True 16–Bit Digital–to–Analog Converter", Burr–Brown Research Corporation Brochure, 1981.

Prazak, Paul and Andrij Mrozowski, "Correcting errors digitally in data acquisition and control", *Electronics*, Nov. 22, 1979, pp. 123–1298.

Schildwach, Bernd and Karl–Heinz Stroetzel, Abgleich und Prüfung von Analog–Digital and Digital Analog Umsetzern.

*Primary Examiner*—Howard L. Williams

[57] ABSTRACT

A calibrated digital-to-analog converter (DAC) is provided that includes a DAC having an interpolation circuit (40) and delta-sigma converter (44). The output of the delta-sigma converter (44) is input to a one-bit DAC (48) and the output thereof filtered by an analog low pass filter section (50). During a calibration procedure, a calibrated analog-to-digital converter (ADC) (22) is utilized that is operable to receive the analog output of the DAC with a "0" value input thereto through a multiplexer (58). The output of the ADC (22) represents the inherent error in the delta-sigma converter (44) and the analog filter section (50). This is stored in a register (62). In a second step of the operation, the contents of the register (62) are input through the interpolation circuit for interpolation thereof and storage in an offset register/latch circuit (56). The contents of the latch (56) are input to a summing junction (54) which, in normal operation, are summed with the output of the interpolation circuit (40) for input to the delta-sigma converter (44). By disposing the summing junction (54) between the interpolation circuit (40) and the delta-sigma modulator (44), the bit load on the input of the interpolation (40) can be reduced. By utilizing the interpolation circuit (40) in the calibration procedure, the gain thereof can be compensated for in the value stored in the register/latch (56).

5 Claims, 2 Drawing Sheets

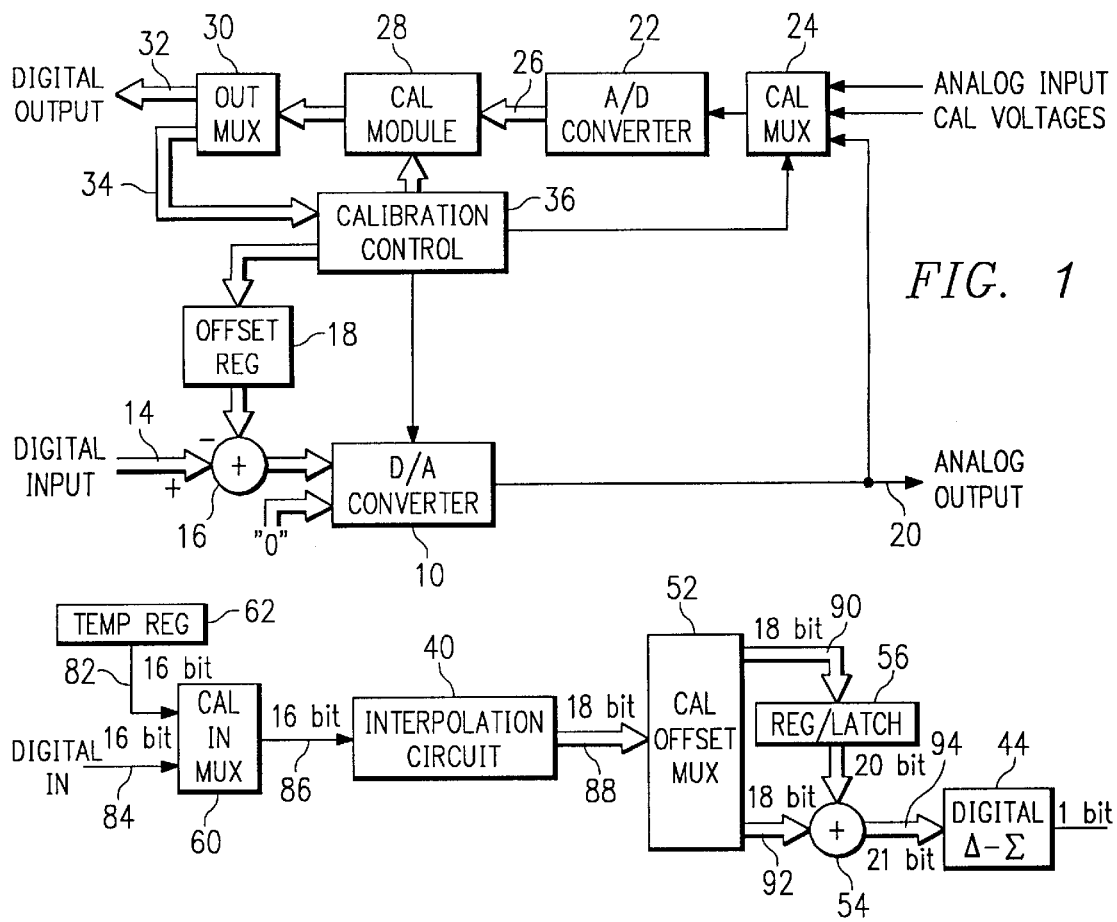
FIG. 1
FIG. 3
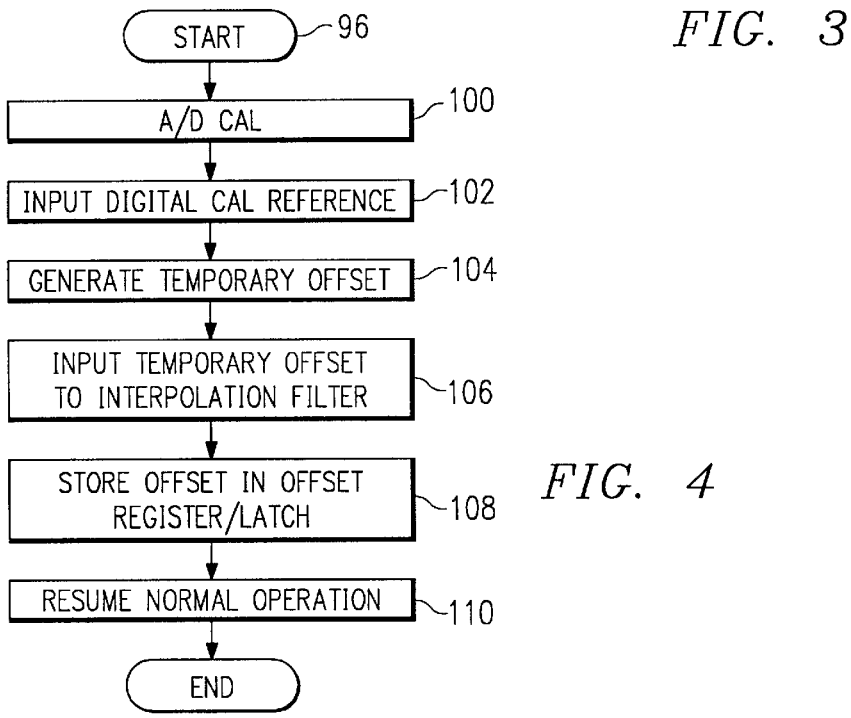
FIG. 4

INTEGRATED CODEC WITH A SELF-CALIBRATING ADC AND DAC

CROSS REFERENCE TO RELATED APPLICATION

This application is a Continuation of U.S. Pat. No. 5,248,970, filed Nov. 8, 1991, Ser. No. 07/790,574 entitled "Offset Calibration of a DAC Using a Calibrated ADC", and is related to U.S. Pat. No. 4,943,807, entitled "Digitally Calibrated Delta-Sigma Analog-to-Digital Converter" and U.S. Pat. No. 5,087,914, entitled "DC Calibration System for a Digital-to-Analog Converter".

TECHNICAL FIELD OF THE INVENTION

The present invention pertains in general to digital-to-analog converters, and more particularly, to a calibration system for removing the DC offset from the digital-to-analog converter and its associated reconstruction filter.

BACKGROUND OF THE INVENTION

In the digital audio and telecommunications field, the high accuracy and high resolution digital-to-analog conversion (DAC) technology has become one of the key analog circuit technologies. Conventionally, either the weighted network circuit technique with trimming, or the multislope integration technique has been utilized for high resolution DAC's. In the weighted network, some trimming of the weighted network utilizing a laser, dynamic element matching, or the digital method utilizing Read-Only Memory (ROM), was required. This is due to the conversion accuracy, which depended in large part on the device matching tolerance of the weighted network. Typically, untrimmed weighted networks would yield a 14-bit accuracy, whereas the trimmed network could obtain a conversion accuracy of over 15-bits. In the multislope integration circuit technique, on the other hand, integrators, sample and hold circuits and current sources are required, which of necessity must be high speed devices with relatively high accuracy. High resolution DAC's utilizing this technology are difficult to realize due to the sample charge and the sample capacitor leaking through the base impedance of the transistors, which typically utilize bipolar technology.

Another technique that has come to the forefront in DAC technology is that utilizing oversampling conversion techniques. These are configured with a delta-sigma modulator in conjunction with conventional oversampling noise shaping techniques utilizing digital filters. Typically, an interpolation filter is utilized to increase the sample rate and then filter all images and quantization noise at $f_s/2$ and above, $f_s$ being the input sampling frequency. The delta-sigma modulator receives the output of the interpolation filter and converts this oversampled signal to a one-bit data stream. This one-bit output controls a DAC, which has only two analog levels and, therefore, is inherently linear. This signal is then input to an analog low pass filter.

With the oversampling noise and shaping techniques utilized with high resolution DAC's, two problems have been recognized—DC Offset and Phase Linearity. The digital portion of the DAC comprising the interpolation filter, sample and hold circuit and the delta-sigma modulator can be designed such that they are substantially phase linear, and DC offset can also be provided. However, when the analog portion of the overall DAC system is implemented, i.e., the analog low pass filter, an additional level of DC offset may be introduced into the system in addition to a phase response non-linearity. It is very difficult to remove DC offset and provide a linear phase response in the analog portion of the DAC converter system. In applications such as digital audio, this DC offset and phase response linearity is audible and attracts from the high quality of audio that is desired. One solution to this problem has been to provide an offset register in the digital-to-analog converter, which offset represents the results of a calibration step. This offset is then summed during normal operation with a digital input to account for the various non-linearities that exist in the delta-sigma modulator. This is described in U.S. patent application Ser. No. 571,375, filed Aug. 22, 1990, and entitled "DC Calibration System for a Digital-to-Analog Converter", which is incorporated herein by reference. This system utilizes a calibration control circuit that is operable to place the digital-to-analog converter into a calibration mode and, with a successive approximation controller, to generate an offset number. However, the successive approximation controller requires a large amount of circuitry and a completely separate block that is utilized only for calibration. Therefore, there exists a need for a more efficient calibration controller for calibrating a digital-to-analog converter.

SUMMARY OF THE INVENTION

The present invention disclosed and claimed herein comprises an integrated CODEC that includes both an on-board analog-to-digital converter and an on-board digital-to-analog converter. The analog-to-digital converter is operable to receive an analog input signal and convert it to a digital signal during a normal operating mode. Similarly, the digital-to-analog converter is operable to receive a digital input signal and convert it to an analog output signal during the normal operating mode. Each of the analog-to-digital converter and digital-to-analog converter is operable to run in a calibration mode during a CODEC calibration operation. The calibration circuit is operable to control both the analog-to-digital converter and digital-to-analog converter in the calibration mode and receive common calibration input signals for calibration thereof to calibrate both the analog-to-digital converter and digital-to-analog converter in accordance with the predetermined calibration guidelines.

In another aspect of the present invention, the calibration operation of the digital-to-analog converter utilizes the analog-to-digital converter as an integral part thereof. First and second periods are provided in the calibration operation, one for calibrating the analog-to-digital converter and one for calibrating the digital-to-analog converter. An ADC calibration circuit is provided for calibrating the analog-to-digital converter during the first period in accordance with a first predetermined calibration procedure. The calibrated analog-to-digital converter is then utilized in the second period by a DAC calibration circuit to calibrate the digital-to-analog converter in accordance with a second calibration procedure. In the second calibration procedure, an offset register is provided for storing a digital offset value for offsetting inherent errors within the digital-to-analog converter. The digital value is determined by forcing the digital input signal on the input to the digital-to-analog converter to a predetermined calibrating digital input signal. The analog output level is then input to the input of the calibrated analog-to-digital converter and the output thereof provides the offset value for storage in the offset register.

In yet another aspect of the present invention, the analog-to-digital converter is operable to operate in a calibration mode and in a normal mode. In the normal mode of operation, the input of the analog-to-digital converter is connected to an external analog input signal and the output thereof provides an external digital output signal corresponding to the external analog input signal.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates a simplified block diagram of the digital-to-analog converter of the present invention;

FIG. 3 illustrates a detail of the offset register/latch utilized in the calibration procedure; and FIG. 4 illustrates a flowchart for the calibration procedure.

DETAILED DESCRIPTION OF THE INVENTION

Figure 2:
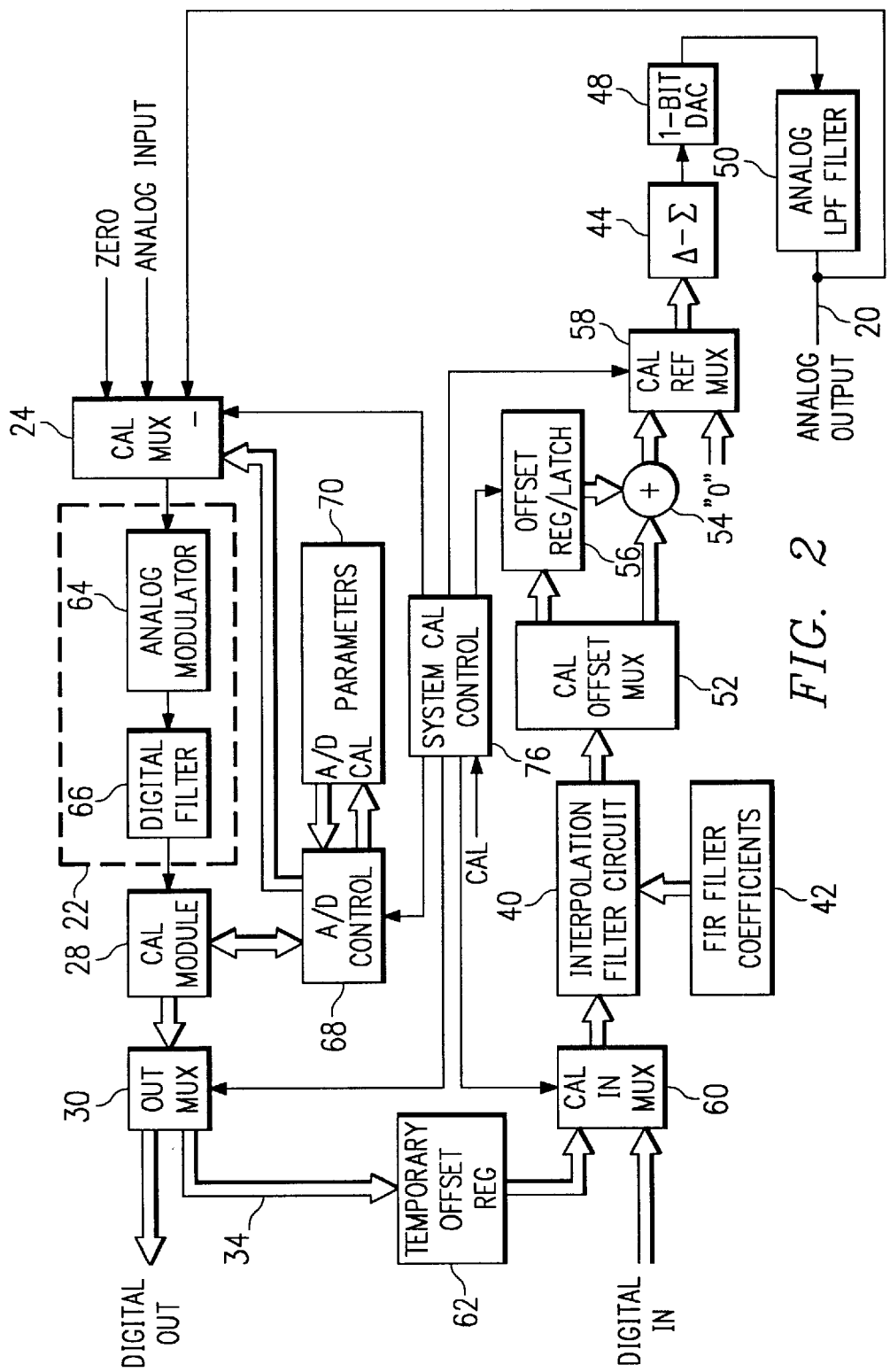
FIG. 2 illustrates a more detailed block diagram of both the digital-to-analog converter and the calibrated analog-to-digital converter utilized for calibration purposes.

Referring now to FIG. 1, there is illustrated a block diagram of the calibrated digital-to-analog converter of the present invention. A general digital-to-analog converter 10 is provided which, as will be described hereinbelow, utilizes an oversampled digital delta-sigma converter and interpolation filter. The digital input is received on an input bus 14 and input to a summing junction 16. The summing junction 16 is operable to subtract the contents of an offset register 18 from the digital value on the digital input 14. As described hereinbelow, the contents of the offset register 18 are arrived at during a calibration step. The output of the summing junction 16 is input to the digital-to-analog converter (DAC) 10 and converted to an analog value. This is output on an analog output 20.

For calibration purposes, a calibrated analog-to-digital converter (ADC) is utilized. The ADC is incorporated in the circuit in the preferred embodiment for the purpose of providing both digital-to-analog conversion and also analog-to-digital conversion. This is a Codec. The ADC is a calibrated ADC that is described in U.S. Pat. No. 4,943,807, entitled "Digitally Calibrated Delta-Sigma Analog-to-Digital Converter", which is incorporated herein by reference. The calibrated ADC is comprised of a general oversampled ADC 22 which has a calibration multiplexer 24 disposed on the input thereof. The calibration multiplexer 24 is operable to select an analog input for normal operation of the ADC portion of the Codec and calibration voltages for use in calibrating the ADC operation. Further, the calibration multiplexer 24 can be controlled to receive the analog output on line 20 which is the result of the digital-to-analog conversion process. The ADC 22 provides a digital output on a bus 26 that is input to a calibration module 28. The calibration module 28 is utilized in a calibration procedure to generate calibration parameters which are stored and later utilized for offset purposes of the digital value output by the ADC 22. The output of the calibration module 28 is input to an output multiplexer 30, which multiplexer 30 is utilized during the calibration of the DAC 10. In normal operation of the analog-to-digital conversion process, a digital output is provided on a digital bus 32. However, during the calibration step of the DAC 10, the output of the multiplexer 30 is routed to a bus 34 for input to a calibration control circuit 36. The calibration control circuit is operable to perform both the calibration of the ADC 22 and also the calibration of the DAC 10. Although not illustrated, the calibration control circuit 36 generates the internal ADC calibration parameters and also is operable to generate the value for storage in the offset register 18, which value is utilized during operation of the digital-to-analog conversion.

In operation, it can be seen that once the ADC 22 is calibrated, the output of the ADC 22 at the output of the calibration module 28 would represent the actual error that exists in the DAC 10 when a digital value of "0" was input to DAC 10, as illustrated in FIG. 1. This would represent a calibration step. In this mode, the offset register 18 and summing junction 16 are bypassed and the digital value "0" input directly to the D/A converter 10. The calibration multiplexer 24 is then controlled to sample the output of the DAC 10 and input it to the calibrated analog-to-digital conversion operation and route this information back to the calibration control circuit 36 for storage in the offset register 18. Thereafter, normal operation would utilize the contents of the offset register 18 to compensate for errors that inherently exist in the D/A converter 10. During the calibration mode, the output of the ADC 22 is a direct measure of the DAC 10 offset if the analog signal range and the resolution of the ADC 22 and DAC 10 are substantially similar.

Referring now to FIG. 2, there is illustrated a more detailed block diagram of the preferred embodiment of the calibration system. The DAC 10 is comprised of an interpolation circuit 40, that includes an interpolation filter. The interpolation filter is a Finite Impulse Response filter (FIR), which has a predetermined set of FIR filter coefficients. These coefficients are stored in a memory 42. Normally, the output of the interpolation circuit 40 is input to a delta-sigma digital modulator 44, which interpolation circuit 40 and delta-sigma modulator 44 form a digital portion that is operable to convert the multi-bit digital input word to a single bit digital stream. This output is then input to a one-bit DAC 48 that converts the one-bit digital stream to an analog value. This analog value is then input to an analog low pass filter 52 to provide the analog output 20. Although a delta-sigma digital modulator is illustrated, it should be understood that any type of one-bit or higher bit quantizer or equivalent can be utilized to provide the conversion to a one-bit digital stream. The delta-sigma modulator is utilized as it provides good low level performance and good differential non-linearity. The general operation of the digital portion is comprised of the interpolation circuit 40 and the delta-sigma modulator 44 is known in the art and described Yasuykui Matsuya, Kuniharu Uchimura, Atsushi Awaiti and Takayo Kaneko, "A 17-Bit Oversampling D-to-A Conversion Technology Using Multi-Stage Noise Shaping", *IEEE J. of Solid-State Circuits,* Vol. 24, No. 4, August 1989 and P. J. Naus, E. C. Dijkmans, E. F. Stikvoort, A. J. McKnight, D. J. Holland and W. Bradinal, "A CMOS Stereo 16-Bit D/A Converter For Digital Audio", *IEEE J. of Solid-State Circuits,* Vol. SC-22, No. 3, June 1987, which are incorporated herein by reference.

The output of the interpolation circuit 40 is input to a calibration offset multiplexer 52, one output of which is connected to the input of a summing junction 54. The other input of the summing junction is connected to the output of an offset register/latch 56, which register/latch 56 is operable to store the offset value. The output of the summing junction 54 is input to a calibration reference multiplexer 58, the output of which is connected to the input of the delta-sigma modulator 44. The other input of the calibration reference multiplexer 58 is connected to a digital value of "0" for use in the calibration operation. The purpose of the calibration reference multiplexer 58 is to ensure that a true "0" value is input to the delta-sigma converter 44. However, this is only one implementation which is illustrated to described the operation of the present invention. In the preferred embodiment, the "0" value digital word is input directly to the interpolation circuit 40 and the contents of the offset register/latch 56 zeroed. Either method will produce the same results, i.e., to provide an analog output that represents the offset error of the DAC 10.

The input of the interpolation circuit 40 is connected to the output of a calibration input multiplexer 60 that receives one input from a temporary offset register 62 for use in the calibration operation and the other input thereof is connected to the digital input for normal operation. This will be described in more detail hereinbelow.

The ADC 22 is comprised of an analog delta-sigma modulator 64 and a digital filter 66. The output of the calibration multiplexer 24 is input to the analog modulator 64, the output of which is processed through the digital filter to provide the analog output for input to the calibration module 28. During calibration of the ADC 22, an A/D control circuit 68 is provided that controls the calibration multiplexer 24 to input a zero value analog voltage and, with the calibration module 28, generate the A/D calibration parameters for storage in a storage device 70. During normal operation, the calibration parameters are utilized by the A/D control circuit 68 to control the calibration module 28 to provide an offset at the output of the A/D converter 22. Prior to any calibration of the digital-to-analog conversion section, the A/D calibration parameters must first be determined. A system calibration control circuit 76 is provided for controlling the operation of the A/D control circuit 68 to first determine the A/D calibration parameters, if these parameters have not been previously determined. After the system has determined the analog-to-digital conversion operation is a calibrated operation, then the next step is to perform the digital-to-analog conversion calibration, as will be described in more detail hereinbelow.

The interpolation circuit 40 is typically configured with an interpolation filter. The interpolation filter is configured of a Finite Impulse Response filter having the associated coefficients therefore stored in the memory 42. In the preferred embodiment, the interpolation circuit 40 is configured with a single interpolation filter stage having multiple taps. Although an FIR filter has been utilized in the preferred embodiment, an Infinite Impulse Response (IIR) filter could be utilized. The input to the interpolation circuit 40 is a 16-bit input which is expanded to 24-bits internally within the interpolation circuit. The interpolation circuit 40 is operable to first intersperse zeros between the samples in the digital input sequence followed by a filtering step wherein the pass band response is defined and the images filtered out. This interspersing of zeros simply re-scales the frequency axis, whereas the images of the original, low frequency signal that are contained in the re-scaled frequency domain are filtered out by the digital low pass filtering step performed by the FIR filter. The end result is an interpolator output sequence whose samples occur at a rate that is faster then the input sample rate by a predetermined ratio factor. The general process of interpolation is disclosed in R. E. Crochiere and L. R. Rabiner, "Interpolation and Decimation of Digital Signals: A Tutorial Review", *Proc. of the IEEE*, Vol. 69, PP. 300–331, Mar. 19, 1981, A. B. Oppenheim and R. W. Schafer, "Discrete-Time Signal Processing", Englewood Cliffs, N.J.: Prentice Hall, 1989. Both of these references are incorporated herein by reference.

The FIR filter in the interpolation circuit 40 is realized with a Digital Signal Processing Unit (DSP) that is essentially an Arithmetical Logic Unit (ALU), which has the inputs thereof multiplexed to perform the calculations necessary to realize the filter function. Typically, digital filters are comprised of a series of multiplication and addition/substraction steps which must be executed in a predetermined order, which order is sequential. Therefore, the digital input values are processed through the FIR filter portion of the interpolation circuit 40 in accordance with the coefficients stored in the memory 42. This provides the filtering and interpolation function for output to the calibration offset multiplexer 52.

The delta-sigma modulator 44 is any type of digital delta-sigma modulator. Typically, the delta-sigma modulator is comprised of a plurality of integration stages, the first of which receives the output of a summing junction that is operable to sum a digital input word with a feedback word. The output of each of the integration stages is input to a feed-forward path having a scaling factor associated therewith. The output of the feed-forward paths are summed together and then input to a quantization circuit to quantize the output thereof into the single bit digital data stream that is input to the DAC 48. This single bit digital data stream is also utilized to select one of two feedback words for input to the summing junction. This is a conventional technique.

The analog low pass filter section 50 is comprised of a switched capacitor third order Butterworth low-pass filter the output of this filter comprising the analog output 20. This filter is followed by a continuous time second order Butterworth low-pass filter that is not compensated for, although this stage could be incorporated in the compensation method of the present invention. The switched capacitor filter is described in detail in U.S. patent application Ser. No. 571,375, which was incorporated herein by reference. Essentially, it is comprised four switched capacitor stages that are configured in a conventional manner.

Since some out of band noise exists on the analog output 20, the ADC 22 provides additional filtering during the calibration mode. This filtering is provided by the ADC 22 in the digital filter 66, which is an inherent part of an ADC utilizing a delta-sigma analog modulator. If another type of ADC were utilized, such as a successive approximation ADC, additional filtering in the digital or analog domain would be required to achieve an accurate measure of the offset for the DAC 10.

During calibration of the digital-to-analog converter portion, and after the A/D converter has been calibrated, a "CAL" signal is received by the system calibration control circuit 76. This calibration control signal can be internally generated as a result of a reset operation, some type of overflow operation or it can be an external signal. When this signal is received, the system calibration control circuit 76 first performs a calibration of the ADC section and then the system enters a mode whereby the digital-to-analog converter is calibrated. In this mode, the input to the digital delta-sigma converter 44 is disconnected from the summing junction 54 and a "0" digital word input thereto. This insures testing for a zero value. The analog output of the analog low-pass filter section 50 is then selected by the calibration multiplexer 24 for input to the ADC 22. The output of the calibration module 28 then represents as a digital value the error in the delta-sigma modulator, and the subsequent circuitry such as the DAC 48 and the analog low-pass filter section 50, since a zero value word was input to the delta-sigma modulator 44. This digital value is then stored in a temporary offset register 62.

As described above with reference to FIG. 1, the value stored in register 62 represents the offset and could be summed with the input to provide the overall desired operation. However, other factors need to be considered. For example, when the summation of the offset value with the input value is performed prior to inputting the data to the interpolation circuit 40, this will require an additional bit of data to be added to the input data bus as a result of the summation operation. The interpolation filter on the input thereof requires the highest speed and most complex portion of the circuitry to be disposed at the input. By adding a single bit to the input, this requires more complex circuitry to be utilized. Therefore, it is more desirable to place the summation operation after the interpolation filtering step. This, however, does provide a disadvantage in that the gain of the interpolation filter section may not be unity. In the preferred embodiment, the gain of the interpolation filter section is not unity. Therefore, this will result in some gain factor that must be multiplied with the contents of the temporary register 62. This can be done with a multiplication circuit by determining what the gain factor is and then multiplying the offset value by this factor. However, in the preferred embodiment, the architecture is configured such that the offset value is determined utilizing the interpolation circuit 40.

Referring now to FIG. 3, there is illustrated a detail of the interpolation circuit 40 and the surrounding data buses, not illustrating the calibration reference multiplexer 58 and the FIR filter coefficient memory 42. In the preferred embodiment, the data stored in the temporary offset register 62 is a 16-bit word which is input to the calibration input multiplexer 60 through a serial line 82 by a shift operation. The digital input word is also a 16-bit word which is input to the calibration input multiplexer 60 on a serial line 84. The output of the calibration input multiplexer 60 is a serial line 86 that is input to the interpolation circuit 40. As described above, the interpolation circuit would be more complex if a higher number of bits was accommodated on the bus 86. Typically, the interpolation circuit 40 during the filtering operation will generate 23-bits of data. After the interpolation function, the number of bits is truncated to 18-bits. This truncation operation is designed primarily to reduce the resolution of the output digital word to a practical value and to reduce the overall number of bits that is to be processed thereafter. This is output on an 18-bit data bus 88 to the calibration offset multiplexer 52. The output of the calibration offset multiplexer 52 has one output thereof connected through an 18-bit data bus 90 to the input of the register/latch 56 and through an 18-bit data bus 92 to the other input of the summation junction 54. The register/latch 56, in the preferred embodiment, contains 20-bits such that the output thereof is a 20-bit output. Therefore, the output of the summation junction 54 is a 21-bit data bus 94, an additional bit required for the summation operation. This is then input to the digital delta-sigma converter 44. It can therefore be seen that the additional bit due to the summation operation is accommodated by the digital delta-sigma converter 44 as opposed to the interpolation circuit 40.

Referring further to FIG. 2, the operation of the digital calibration will be described. In the first operation, as described above, the offset is determined for the overall DAC 10, the majority of the error resulting from the operation of the one-bit DAC 48 and analog low pass filter 50. However, since the summing junction 54 is disposed after the interpolation circuit 40, some compensation must be made of for the gain of the interpolation circuit 40. This is facilitated by inputting the contents of the temporary offset register 62 after determination thereof to the input of the interpolation circuit 40 through the calibration input multiplexer 60. The calibration offset multiplexer 52 then takes the interpolated output from the interpolation circuit 40 and inputs this to the offset register/latch 56, which information is then latched therein. As such, the digital value stored in the register/latch 56 now accounts for any gain variations in the interpolation circuit 40. After the contents of the register/latch 56 have been determined, the calibration input multiplexer 60 is returned to its normal operational mode and the calibration offset multiplexer 52 is returned to its normal operation mode. The analog output 20 is a differential output and the input to modulator 64 is a differential input. The positive output of the analog output 20 is connected to the negative input of the analog modulator 64 during calibration to effect an inversion in the data path. The purpose of this inversion is such that the contents of the register/latch 56 can be summed and not subtracted, since a subtraction operation requires a twos complement to be performed.

Referring now to FIG. 4, there is illustrated a flowchart depicting the overall operation of the calibration procedure for the digital-to-analog conversion section. The sequence is initiated at a start block 96 and then input to a function block 100 to perform the analog-to-digital conversion calibration operation. The program will then flow from block 100 to the input of a block 102 to input the digital calibration reference to the delta-sigma converter 44.

After the digital value has been input to the calibration reference multiplexer 58, this being a zero value, the temporary offset would then be generated for storage in the offset register 62, as indicated by function block 104. The contents of the temporary offset register are then input to the interpolation circuit 40, as indicated by function block 106 and then the output thereof stored as an offset in the offset register/latch 56, as indicated by a function block 108. The system then returns to a normal operational mode, as indicated by function block 110.

In summary, there has been provided a method and apparatus for calibrating a digital-to-analog converter utilizing an oversampled digital delta-sigma conversion section. A calibrated analog-to-digital converter is utilized in a calibration operation to determine the error by first inputting a zero value to the digital-to-analog converter and then storing the contents output by the analog-to-digital converter in an offset register. Since the analog-to-digital conversion operation is calibrated, this represents the actual error in the digital-to-analog converter as a digital value. The offset is summed in the digital-to-analog converter after the interpolation filter section and, during calibration, the gain variations of the interpolation section are accounted for by incorporating the interpolation filter section in the calibration procedure.

Although the preferred embodiment has been described in detail, it should be understood that various changes, substitutions and alterations can be made therein without departing from the spirit and scope of the invention as defined by the appended claims.

What is claimed is:

1. An integrated CODEC comprising:
    an analog-to-digital converter for receiving an analog input signal and converting it to a digital output signal in a normal operating mode, said analog-to-digital converter operable to be switched to a calibration mode during a CODEC calibration mode;
    a digital-to-analog converter for receiving an analog input signal and converting it to a digital output signal in the normal operating mode, said digital-to-analog converter operable to be switched to the calibration mode during the CODEC calibration operation; and a calibration circuit common to both said analog-to-digital converter and said digital-to-analog converter for controlling said analog-to-digital converter and said digital-to-analog converter during the CODEC calibration operation to operate in the calibration mode, said analog-to-digital converter and digital-to-analog converter in the calibration mode operable to be calibrated by said calibration circuit that receives common calibration input signals for calibrating said analog-to-digital converter and said digital-to-analog converter in accordance with predetermined calibration guidelines.

2. The integrated CODEC of claim 1, wherein said calibration circuit operates in a first calibration period and a second calibration period following said first calibration mode and said calibration circuit comprises:

an ADC calibration circuit for calibrating the analog-to-digital converter during said first calibration period; and a DAC calibration circuit for utilizing said analog-to-digital converter during said second period to calibrate said digital-to-analog converter by connecting the input of said analog-to-digital converter to the output of said digital-to-analog converter.

3. The integrated CODEC of claim 1, wherein said analog-to-digital converter has a multiplexer associated with the input thereof, said multiplexer operable to be connected to calibration input reference voltages during said first period in accordance with a predetermined calibration procedure for calibrating said analog-to-digital converter and, during said second period, being connected to the output of said digital-to-analog converter.

4. The integrated CODEC of claim 1, wherein said digital-to-analog converter has an inherent error associated therewith and said DAC calibration circuit includes an offset circuit for offsetting the analog output level of said digital-to-analog converter by an offset value for a given digital input value on the input of said digital-to-analog converter, said digital-to-analog converter operable to determine said offset value utilizing the digital output of said analog-to-digital converter after calibration thereof by said ADC calibration circuit.

5. The integrated CODEC of claim 1, wherein said DAC calibration circuit comprises:

an offset circuit for offsetting the analog output level of said digital-to-analog converter by an offset value for a given digital input value to said digital-to-analog converter, said digital-to-analog converter having associated therewith an inherent error;

a circuit for forcing the digital input signal to said digital-to-analog converter to a predetermined calibrating digital input signal; and circuitry for determining the analog output level of said analog output signal output by said digital-to-analog converter when said predetermined calibrated digital input signal is input to said digital-to-analog converter;

the output of said analog-to-digital converter providing as the output said offset value, which said offset value corresponds to said predetermined calibrating digital input signal plus the inherent error in said digital-to-analog converter.

* * * * *